(12) United States Patent
Chen et al.

(10) Patent No.: US 12,205,932 B2
(45) Date of Patent: Jan. 21, 2025

(54) DISPLAY DEVICE WITH VARYING NUMBER OF LIGHT EMITTING UNITS IN RED, GREEN, AND BLUE SUB-PIXELS

(71) Applicant: InnoLux Corporation, Miao-Li County (TW)

(72) Inventors: Jia-Yuan Chen, Miao-Li County (TW); Tsung-Han Tsai, Miao-Li County (TW); Kuan-Feng Lee, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 0 days.

(21) Appl. No.: 18/502,077

(22) Filed: Nov. 5, 2023

(65) Prior Publication Data

US 2024/0072018 A1 Feb. 29, 2024

Related U.S. Application Data

(63) Continuation of application No. 17/148,496, filed on Jan. 13, 2021, now abandoned.

(30) Foreign Application Priority Data

Feb. 10, 2020 (CN) .......................... 202010085133.9

(51) Int. Cl.
*H01L 29/20* (2006.01)
*H01L 25/075* (2006.01)
(Continued)

(52) U.S. Cl.
CPC ........ *H01L 25/0753* (2013.01); *H01L 25/167* (2013.01); *H01L 33/20* (2013.01)

(58) Field of Classification Search
CPC ... H01L 25/0753; H01L 25/167; H01L 33/20; H01L 33/50; H01L 27/3211;
(Continued)

(56) References Cited

U.S. PATENT DOCUMENTS

| 11,037,912 | B1* | 6/2021 | Meitl | ................... H01L 25/167 |
| 2012/0092388 | A1* | 4/2012 | Kamon | ................ G09G 3/3426 345/88 |

(Continued)

FOREIGN PATENT DOCUMENTS

| CN | 101315483 A | 12/2008 |
| CN | 103021334 A | 4/2013 |

(Continued)

*Primary Examiner* — Ismail A Muse
(74) *Attorney, Agent, or Firm* — Winston Hsu

(57) ABSTRACT

A display device includes a blue sub-pixel including a plurality of first light emitting units in a number of N1, a green sub-pixel including a plurality of second light emitting units in a number of N2, and a red sub-pixel including a plurality of third light emitting units in a number of N3. The first light emitting units, the second light emitting units and the third light emitting units all emit lights of blue color, and a green wavelength conversion layer and a red wavelength conversion layer are so arranged that the blue light from the second light emitting units and the blue light from the third light emitting units go through the green wavelength conversion layer and the red wavelength conversion layer respectively. N1 is greater than or equal to 6. N1<N2 and N1<N3, wherein N2/N1 is between 2.1 and 3.68, and N3/N1 is between 1.52 and 2.53.

9 Claims, 5 Drawing Sheets

(51) Int. Cl.
*H01L 33/00* (2010.01)
*H01L 25/16* (2023.01)
*H01L 33/20* (2010.01)

(58) Field of Classification Search
CPC ............... H01L 27/156; H01L 27/3216; H01L 27/3218; H01L 27/322; H01L 33/504; H01L 27/1214; H01L 33/62
See application file for complete search history.

(56) References Cited

U.S. PATENT DOCUMENTS

| 2019/0318685 | A1* | 10/2019 | Park | .......................... | G09G 3/32 |
| 2020/0111842 | A1* | 4/2020 | Kim | ..................... | H10K 59/122 |
| 2021/0317365 | A1* | 10/2021 | Yang | ..................... | G03F 7/0275 |
| 2022/0381957 | A1* | 12/2022 | Ji | ........................ | H10K 59/121 |
| 2022/0415977 | A1* | 12/2022 | Lee | ...................... | H01L 25/167 |

FOREIGN PATENT DOCUMENTS

| CN | 107229155 A | 10/2017 |
| CN | 110379829 A | 10/2019 |

* cited by examiner

DISPLAY DEVICE WITH VARYING NUMBER OF LIGHT EMITTING UNITS IN RED, GREEN, AND BLUE SUB-PIXELS

CROSS REFERENCE TO RELATED APPLICATIONS

This application is a continuation application of U.S. application Ser. No. 17/148,496, filed on Jan. 13, 2021. The content of the application is incorporated herein by reference.

BACKGROUND OF THE DISCLOSURE

1. Field of the Disclosure

The present disclosure relates to a display device, more particularly to a display device having a design of the light emitting units.

2. Description of the Prior Art

In display devices, the light emitting unit is usually miniaturized. However, when the size of the light emitting unit becomes smaller, the light emitting efficiency may be reduced. Therefore, to improve the configuration of the light emitting unit to achieve the required luminous intensity is still an important issue.

SUMMARY OF THE DISCLOSURE

A display device is provided by the present disclosure, wherein the numbers of the light emitting units in the sub-pixels of the display device may be designed and the different sub-pixels may be used to form the required white light.

In some embodiments, a display device comprises a blue sub-pixel, a green sub-pixel and a red sub-pixel. The blue sub-pixel comprises a plurality of first light emitting units in a number of N1, the green sub-pixel comprises a plurality of second light emitting units in a number of N2, and the red sub-pixel comprises a plurality of third light emitting units in a number of N3, wherein an area of the green sub-pixel is greater than an area of the red sub-pixel, the area of the red sub-pixel is greater than an area of the blue sub-pixel, the first light emitting units, the second light emitting units and the third light emitting units all emit lights in a color of blue, and a green wavelength conversion layer and a red wavelength conversion layer are so arranged that the blue light from the second light emitting units and the blue light from the third light emitting units go through the green wavelength conversion layer and the red wavelength conversion layer respectively, wherein N1 is greater than or equal to 6, N1<N2 and N1<N3, wherein N2/N1 is between 2.1 and 3.68, and N3/N1 is between 1.52 and 2.53.

In some embodiments, a display device comprises a blue sub-pixel, a green sub-pixel and a red sub-pixel. The blue sub-pixel comprises a plurality of first light emitting units in a number of N1, the green sub-pixel comprises a plurality of second light emitting units in a number of N2, and the red sub-pixel comprises a plurality of third light emitting units in a number of N3, wherein an area of the green sub-pixel is greater than an area of the red sub-pixel, the area of the red sub-pixel is greater than an area of the blue sub-pixel, the first light emitting units, the second light emitting units and the third light emitting units all emit lights in a color of blue, and a green wavelength conversion layer and a red wavelength conversion layer are so arranged that the blue light from the second light emitting units and the blue light from the third light emitting units go through the green wavelength conversion layer and the red wavelength conversion layer respectively, wherein N1<N2 and N1<N3, wherein N2/N1 is between 2.1 and 3.68, and N3/N1 is between 1.52 and 2.53.

These and other objectives of the present disclosure will no doubt become obvious to those of ordinary skill in the art after reading the following detailed description of the embodiment that is illustrated in the various figures and drawings.

DETAILED DESCRIPTION

Figure 1:
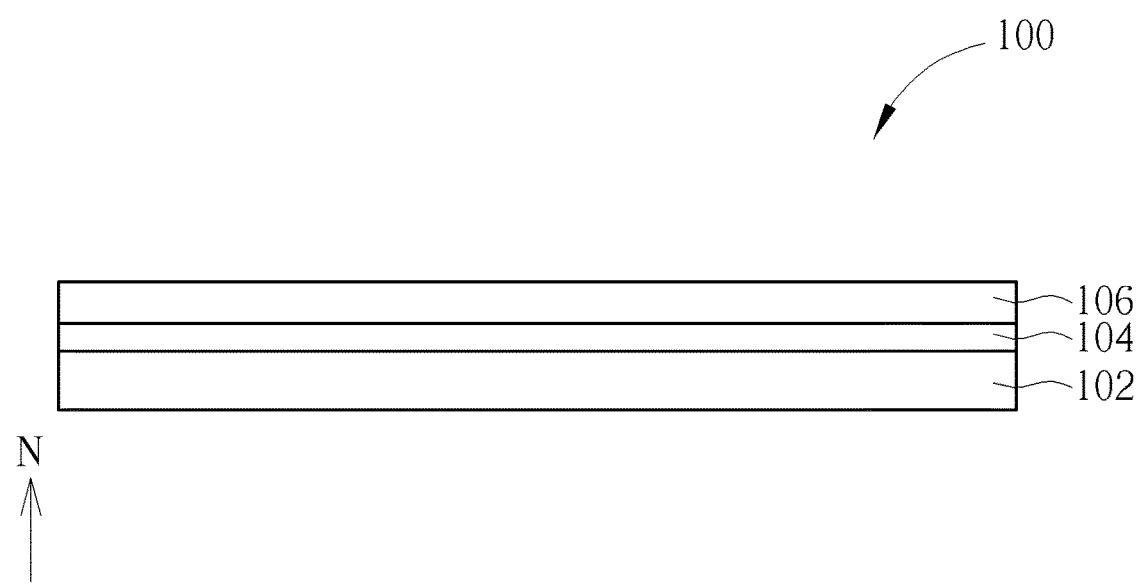
FIG. 1 schematically illustrates a cross-sectional view of a display device according to a first embodiment of the present disclosure.

The present disclosure may be understood by reference to the following detailed description, taken in conjunction with the drawings as described below. It is noted that, for purposes of illustrative clarity and being easily understood by the readers, various drawings of this disclosure show a portion of the electronic device, and certain elements in various drawings may not be drawn to scale. In addition, the number and dimension of each element shown in drawings are only illustrative and are not intended to limit the scope of the present disclosure.

Certain terms are used throughout the description and following claims to refer to particular elements. As one skilled in the art will understand, electronic equipment manufacturers may refer to an element by different names. This document does not intend to distinguish between elements that differ in name but not function.

In the following description and in the claims, the terms "include", "comprise" and "have" are used in an open-ended fashion, and thus should be interpreted to mean "include, but not limited to . . . ".

It will be understood that when an element or layer is referred to as being "disposed on" or "connected to" another element or layer, it can be directly on or directly connected to the other element or layer, or intervening elements or layers may be presented (indirectly). In contrast, when an element is referred to as being "directly on" or "directly connected to" another element or layer, there are no intervening elements or layers presented.

The terms "approximately", "equal to", "equal" or "the same", "substantially" or "approximately" are generally interpreted as being within a range of ±20% of the given value, or interpreted as being within a range of ±10%, ±5%, ±3%, ±2%, ±1% or ±0.5% of the given value.

Although terms such as first, second, third, etc., may be used to describe diverse constituent elements, such constituent elements are not limited by the terms. The terms are used only to discriminate a constituent element from other constituent elements in the specification. The claims may not use the same terms, but instead may use the terms first, second, third, etc. with respect to the order in which an element is claimed. Accordingly, in the following description, a first constituent element may be a second constituent element in a claim.

It should be noted that the technical features in different embodiments described in the following can be replaced, recombined, or mixed with one another to constitute another embodiment without departing from the spirit of the present disclosure.

In display devices, the light emitting unit is usually miniaturized. However, the problem of poor luminous efficiency may be occurred when the light emitting unit is miniaturized in the prior art. Therefore, a single sub-pixel in the display device of the present disclosure may include a plurality of light emitting units to achieve the required brightness. In another aspect, since the luminous efficiency of each of the light emitting units may be different, when a single sub-pixel includes a plurality of light emitting units, it also helps to mitigate the problem of uneven brightness of the sub-pixels caused by the difference of the luminous efficiency of the light emitting units.

According to the research, when each of the sub-pixels includes at least six light emitting units, the failure rate of the display device can be significantly reduced. The number mentioned above will be used as a reference value in each of the embodiments in the following to decide the number of the light emitting units in different sub-pixels. It should be noted that although six light emitting units are used as a reference to design the number of the light emitting units in the present disclosure, the present disclosure is not limited thereto. In addition, it should be noted that the light emitting unit mentioned above may for example include light emitting diode (LED) such as organic light emitting diode (OLED), quantum dot light emitting diode (QLED or QDLED), mini LED or micro LED, other types of light emitting diode or the combinations of the above-mentioned light emitting diodes, but not limited thereto.

Referring to FIG. 1, FIG. 1 schematically illustrates a cross-sectional view of a display device according to a first embodiment of the present disclosure. As shown in FIG. 1, the display device 100 of the present embodiment may include a substrate 102, a display layer 104 and a cover layer 106. The substrate 102 may be a rigid substrate (such as glass substrate, quartz substrate, ceramic substrate or sapphire substrate, but not limited thereto), a flexible substrate (such as polyimide (PI) substrate, polycarbonate (PC) substrate or polyethylene terephthalate (PET) substrate), other suitable substrates or the combinations of the above-mentioned substrates, but not limited thereto. In addition, the substrate 102 may further include suitable layers such as insulating layer, adhesive layer and/or supporting layer in some embodiments, but not limited thereto. The cover layer 106 may cover the display layer 104 to protect the electronic components or layers of the display layer 104, wherein the cover layer 106 may for example include cover glass, organic film, inorganic film, optical layer, other suitable layers or the combinations of the above-mentioned layers, or, the cover layer 106 may be replaced with another substrate, wherein the material of the another substrate may be similar to the material of the substrate 102, but not limited thereto. The display layer 104 may include any suitable layer or element for displaying images in the display device 100. For example, the display layer 104 may include light emitting units, driving elements and/or light converting elements, but not limited thereto. According to the present embodiment, the light emitting unit may for example include the light emitting diodes mentioned above. The driving element may drive the light emitting unit to display images, and the driving element may for example include a thin film transistor (TFT), wherein the thin film transistor may for example be a top-gate thin film transistor, a bottom-gate thin film transistor, a dual-gate thin film transistor or a multi-gate thin film transistor, but not limited thereto. The light converting element may include any material capable of converting the wavelength of light, for example, the light converting element may include quantum dot, fluorescence, phosphor, color filter, other suitable materials or the combinations of the above-mentioned materials, but not limited thereto.

Figure 2:
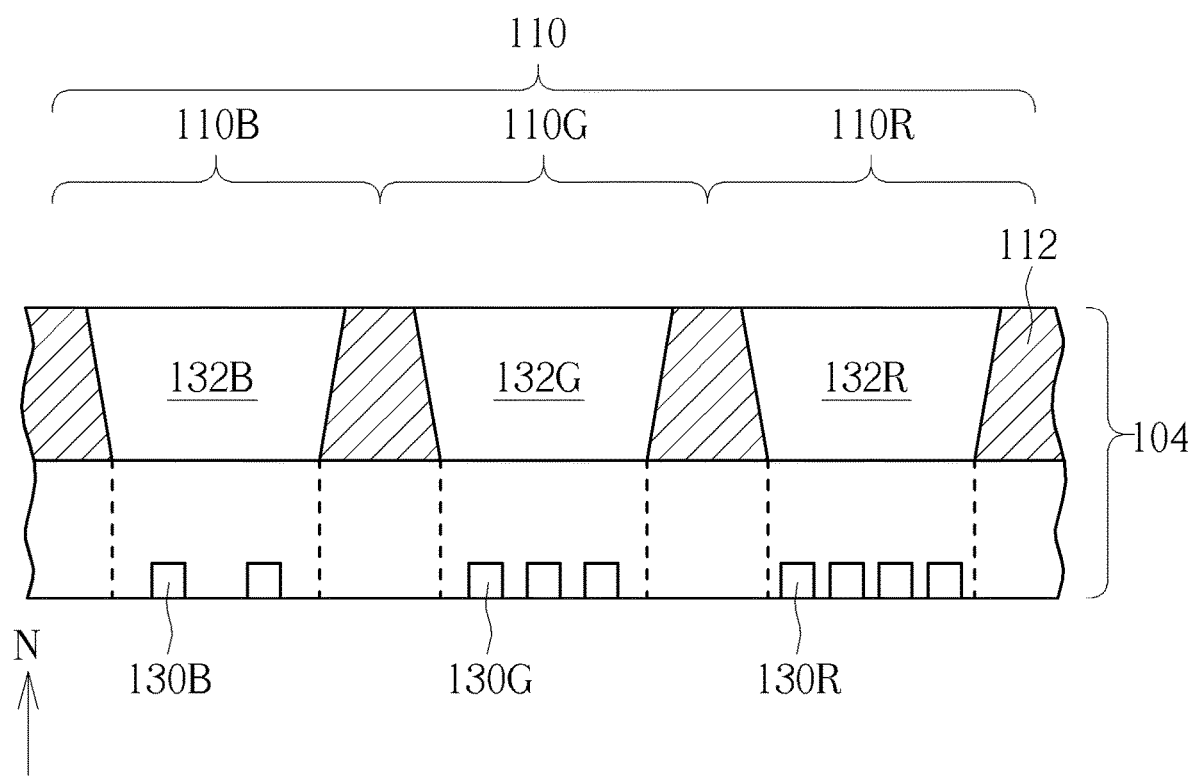
FIG. 2 schematically illustrates a cross-sectional view of a display layer of a display device according to the present disclosure.
Figure 3:
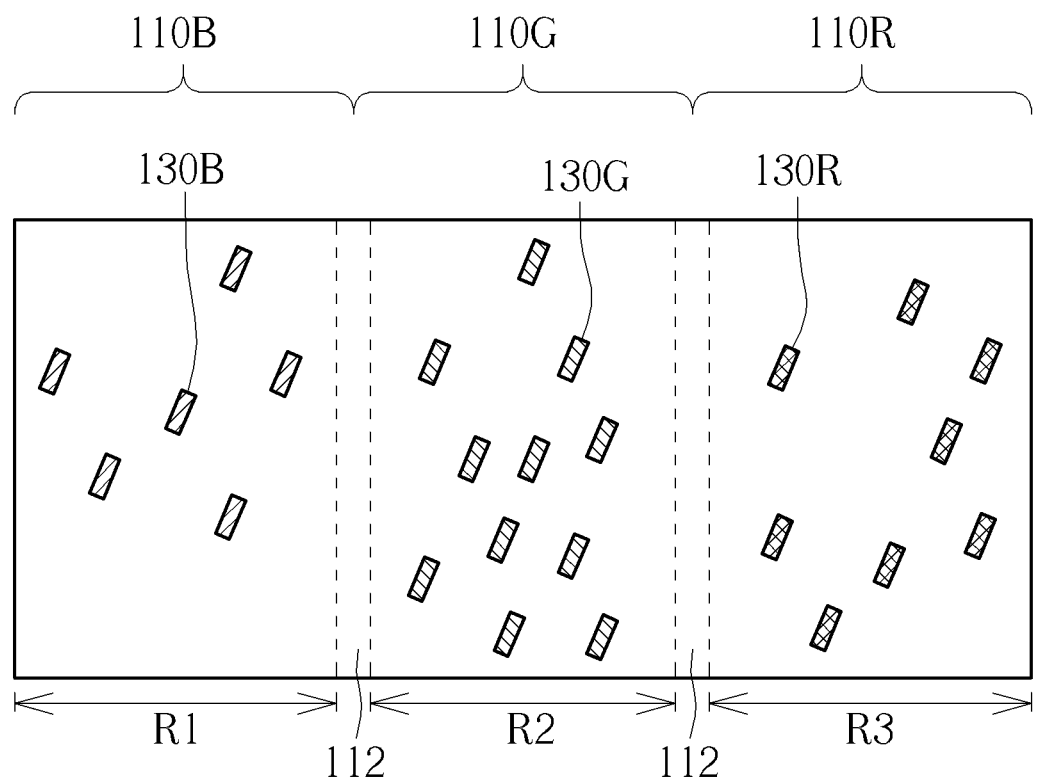
FIG. 3 schematically illustrates a distribution of light emitting units in the display layer shown in FIG. 2.

The first embodiment of the present disclosure will be described in the following. Referring to FIG. 2 and FIG. 3, FIG. 2 schematically illustrates a cross-sectional view of a display layer of a display device according to the present disclosure, and FIG. 3 schematically illustrates a distribution of light emitting units in the display layer shown in FIG. 2. In detail, FIG. 3 is a schematic view of the distribution of light emitting units in the display layer shown in FIG. 2 in a top view (that is, the observer observes the display layer in a direction parallel to the normal direction N of the substrate). According to the present embodiment, the display layer 104 may include at least one pixel 110, the pixel 110 may include a plurality of sub-pixels, and each of the sub-pixels may respectively include light emitting units and/or light converting elements, but not limited thereto. For example, as shown in FIG. 2, the pixel 110 may for example be composed of a red sub-pixel 110R, a green sub-pixel 110G and a blue sub-pixel 110B, but the types of the sub-pixels is not limited thereto. The positions of different sub-pixels (such as the red sub-pixel 110R, the green sub-pixel 110G and the blue sub-pixel 110B) may for example be defined by the alight shielding material 112 in the display layer 104, wherein the light shielding material 112 may for example be a black matrix (BM), a gray matrix or a white matrix, but not limited thereto. In addition, although the cross-sectional view of the light shielding material 112 is a trapezoid in FIG. 2, the present disclosure is not limited thereto. The red sub-pixel 110R may include light emitting units 130R and a layer 132R, the green sub-pixel 110G may include light emitting units 130G and a layer 132G, and the blue sub-pixel 110B may include light emitting units 130B and a layer 132B. According to the present embodiment, the light emitting units 130R may include red light emitting diodes, the light emitting units 130G may include green light emitting diodes, and the light emitting units 130B may include blue light emitting diodes, wherein the type of the light emitting diodes may for example be small-sized light emitting diodes such as mini LED and micro LED, but not limited thereto. It should be noted that when a single sub-pixel includes the light emitting units capable of generating a light with a color corresponding to the color of the sub-pixel, the sub-pixel may not include the light converting element, that is, the layer 132R, the layer 132G and the layer 132B may not include the light converting element. For example, the layer 132R, the layer 132G and the layer 132B may not include the light converting element, but include a scattering layer for scattering the light passing through it, or, the layer 132R, the layer 132G and the layer 132B may include a transparent layer or other layers that do not have the function of converting the color of the light, but not limited thereto. In addition, FIG. 2 is only a schematic view of the light emitting units, the light converting elements and different sub-pixels of the display layer 104, and the driving elements for driving the light emitting units and other suitable electronic elements or layers are not drawn in FIG. 2. FIG. 3 is a schematic view of light emitting regions corresponding to different sub-pixels in a top view. In detail, a region R1 shown in FIG. 3 is corresponding to the light emitting region (that is, the region not covered by the light shielding material 112) of the blue sub-pixel 110B shown in FIG. 2, a region R2 shown in FIG. 3 is corresponding to the light emitting region of the green sub-pixel 110G shown in FIG. 2, and a region R3 shown in FIG. 3 is corresponding to the light emitting region of the red sub-pixel 110R shown in FIG. 2. It is shown in the region R1, the region R2 and the region R3 that different numbers of the light emitting units 130B, the light emitting units 130G and the light emitting units 130R may be disposed in each of the sub-pixels respectively. It should be noted that the disposing method of the light emitting units shown in FIG. 3 is only illustrative, which does not represent the real position and the real number of the light emitting units in each of the regions. The color lights generated by different sub-pixels of the display device may be mixed to form the white light. Therefore, the design of the numbers of the light emitting units in each of the sub-pixels will be described in detail in the following in order to mix the lights of different sub-pixels of the present embodiment to generate the white light.

Generally, human eyes have different sensitivity to different colors. Specifically, the visual sensitivity of human eyes to the green light may be greater than the visual sensitivities of human eyes to the red light and the blue light. Therefore, when a white light having target brightness is formed by mixing, the proportion of the green light in the brightness perceived by the human eyes will be greater than the proportions of the blue light and the red light. In the present embodiment, different sub-pixels may be designed that a white light (such as the D65 white light) may be formed by mixing. The D65 white light is the standard light source used in international standards to evaluate the color of objects, and the color temperature thereof is 6500K. It should be noted that although the lights which are mixed to form the D65 white light is taken as an example in the present disclosure, the present disclosure is not limited to forming the D65 white light. The following will briefly explain how to form the white light by mixing.

In the present embodiment of the present disclosure, the main wavelength (the wavelength corresponding to the maximum light intensity) of the light emitted by the light emitting units 130R in the red sub-pixel 110R may for example range from 620 nm (nanometers) to 640 nm, the main wavelength of the light emitted by the light emitting units 130G in the green sub-pixel 110G may for example range from 522 nm to 542 nm, and the main wavelength of the light emitted by the light emitting units 130B in the blue sub-pixel 110B may for example range from 457 nm to 477 nm. It should be noted that the wavelength ranges mentioned above are only illustrative, and the ranges of the main wavelengths of each of the light emitting units are not limited thereto. Under the above mentioned wavelength ranges, if a white light with one unit brightness is to be formed by mixing, the ratio of the amount of light radiation emitted by the red sub-pixel 110R, the green sub-pixel 110G, and the blue sub-pixel 110B is approximately 0.679:0.825: 1.12. In addition, as mentioned above, human eyes have different sensitivity to different colors (or wavelengths) of lights. For example, under the above-mentioned wavelength ranges, the visual sensitivity of human eyes to the red light may be about 0.265 lumen per watt (lm/W), the visual sensitivity of human eyes to the green light may be about 0.885 lm/W, and the visual sensitivity of human eyes to the blue light may be about 0.0803 lm/W. Therefore, if the lights emitted by the red sub-pixel, the green sub-pixel and the blue sub-pixel with the above-mentioned conditions are used to form the white light with a brightness of one lumen, the amount of light radiation of the red sub-pixel 110R, the green sub-pixel 110G and the blue sub-pixel 110B may respectively be 0.679 watt, 0.825 watt and 1.12 watt, 18% (calculated by multiplying the amount of red light radiation by the visual sensitivity of the human eyes to the red light, that is 0.679*0.265=0.18) of the brightness perceived by the human eye comes from the red light, 73% (calculated by multiplying the amount of green light radiation by the visual sensitivity of the human eyes to the green light, that is 0.825*0.885=0.73) of the brightness perceived by the human eye comes from the green light, and 9% (calculated by multiplying the amount of blue light radiation by the visual sensitivity of the human eyes to the blue light, that is 1.12*0.0803=0.09) of the brightness perceived by the human eye comes from the blue light.

It should be noted that although the above-mentioned coefficients are used as reference values when calculating the numbers of the light emitting units in each of the embodiments of the present disclosure, these values are only used for illustrating the theory of the present disclosure and are not intended to limit the scope of the present disclosure. Since the main wavelengths of the lights emitted by different sub-pixels for mixing into the white light may be in other ranges, and the sensitivity of human eyes to the lights in different wavelength ranges will also be different, the number of the light emitting units of the present disclosure is not limited to the above-mentioned coefficient.

According to the present disclosure, the amount of light radiation of one sub-pixel may be related to the number of the light emitting units in the sub-pixel, the luminous intensity of the light emitting unit and the conversion efficiency of the light converting element. When the number of the light emitting units, the luminous intensity of each of the light emitting units, or the conversion efficiency of the light converting element is greater, the amount of light radiation may be increased. Therefore, in order to achieve the desired amount of light radiation, the number of the light emitting units required in each of the sub-pixels may be inversely proportional to the luminous intensity of each of the light emitting units and the conversion efficiency of the light converting element. That is, the relationship between the number of the light emitting units, the luminous intensity, and conversion efficiency of the light converting element may be shown in formula (1).

$$\text{number of light emitting units} \propto \frac{\text{amount of light radiation}}{\text{luminous intensity} \times \text{conversion efficiency}} \qquad (1)$$

The luminous intensity of the light emitting units may be related to the external quantum efficiency (EQE) of each of the light emitting units. When the light emitting units are light emitting diodes in the above-mentioned wavelength ranges, the EQE of the red light emitting units may range from 3% to 10% (3%≤EQE≤10%), the EQE of the green light emitting units may range from 8% to 14% (8%≤EQE≤14%), and the EQE of the blue light emitting units may range from 20% to 30% (20%≤EQE≤30%). In addition, because no light converting element is disposed in the display layer 104 of the present embodiment (for example, the scattering layer or the transparent layer is included in the layer 132R, the layer 132G and the layer 132B), the conversion efficiency of the light converting element in the present embodiment may be regarded as one. According to formula (1), a ratio of a number N3 of the light emitting units 130R of the red sub-pixel 110R to a number N1 of the light emitting units 130B of the blue sub-pixel 110B maybe shown in the following formula (2).

$$\frac{N3}{N1} = \frac{\text{amount of light radiation (red)/EQE (red LED)}}{\text{amount of light radiation (blue)/EQE (blue LED)}} \quad (2)$$

The white light with a brightness of one lumen formed by mixing is taken as an example, wherein the amount of light radiation (red) is the amount of light radiation of the red sub-pixel 110R mentioned above (about 0.679 watt), the amount of light radiation (blue) is the amount of light radiation of the blue sub-pixel 110B mentioned above (about 1.12 watt), the EQE of the red LEDs may range from 3% to 10%, and the EQE of the blue LEDs may range from 20% to 300. Therefore, the ratio of the number N3 of the light emitting units 130R of the red sub-pixel 110R to the number N1 of the light emitting units 130B of the blue sub-pixel 110B may be calculated after introducing the above-mentioned values into formula (2), which may range from 1.21 to 6.06 (1.21≤N3/N1≤6.06). That is, the number N3 of the light emitting units 130R may be greater than the number N1 of the light emitting units 130B. Specifically, the minimum value of the ratio of the number N3 of the light emitting units 130R to the number N1 of the light emitting units 130B is occurred when the EQE of the red LEDs is 10% and the EQE of the blue LEDs is 20%, and the ratio calculated by formula (2) is 1.21 (that is N3/N1=1.21). The maximum value of the ratio of the number N3 of the light emitting units 130R to the number N1 of the light emitting units 130B is occurred when the EQE of the red LEDs is 3% and the EQE of the blue LEDs is 30%, and the ratio calculated by formula (2) is 6.06. That is, in order to form the white light by mixing, the number N3 of the light emitting units 130R (red LEDs) may range from 1.21 to 6.06 when the number N1 of the light emitting units 130B (blue LEDs) is one, and the red sub pixel 110R and the blue sub pixel 110B may have the above-mentioned proportion of amount of light radiation for forming the white light. In addition, according to the research result mentioned above, a single pixel or sub-pixel may include at least six light emitting diodes to improve the display quality of the display device. Therefore, the blue sub-pixel 110B may for example include six light emitting units 130B, and the red sub-pixel 110R may for example include eight to thirty seven light emitting units 130R in the present embodiment, but not limited thereto.

Similarly, except for the ratio of the number of the light emitting units 130R to the number of the light emitting units 130B, the number N2 of the light emitting units 130G included in the green sub-pixel 110G of the present embodiment may be calculated by formula(3).

$$\frac{N2}{N1} = \frac{\text{amount of light radiation (green)/EQE (green LED)}}{\text{amount of light radiation (blue)/EQE (blue LED)}} \quad (3)$$

From the previous description, the white light with a brightness of one lumen formed by mixing is taken as an example, the amount of light radiation (green) is the amount of light radiation of the green sub-pixel 110G mentioned above (about 0.825 watt), and the EQE of the green LEDs may range from 8% to 14%. Therefore, the ratio of the number N2 of the light emitting units 130G of the green sub-pixel 110G to the number N1 of the light emitting units 130B of the blue sub-pixel 110B may be calculated after introducing the above-mentioned values into formula (3), which may range from 1.05 to 2.76 (1.05≤N2/N1≤2.76). For example, the ratio of the number N2 of the light emitting units 130G to the number N1 of the light emitting units 130B may be greater than or equal to 1.05 and less than or equal to 2.76, that is, the number N2 of the light emitting units 130G may be greater than the number N1 of the light emitting units 130B. Specifically, the minimum value of the ratio of the number N2 of the light emitting units 130G to the number N1 of the light emitting units 130B is occurred when the EQE of the green LEDs is 14% and the EQE of the blue LEDs is 20%, and the ratio calculated by formula (3) is 1.05. The maximum value of the ratio of the number N2 of the light emitting units 130G to the number N1 of the light emitting units 130B is occurred when the EQE of the green LEDs is 8% and the EQE of the blue LEDs is 30%, and the ratio calculated by formula (3) is 2.76. That is, the number N2 of the light emitting units 130G of the green sub-pixel 110G may range from 1.05 to 2.76 when the number N1 of the light emitting units 130B of the blue sub-pixel 110B is one, and the light emitting units of the green sub pixel 110G and the blue sub pixel 110B may have the above-mentioned proportion of amount of light radiation for forming the white light. According to the research result mentioned above, when the number N1 of the light emitting units 130B of the blue sub-pixel 110B may for example be six, the number N2 of the light emitting units 130G of the green sub-pixel 110G may for example be seven to seventeen, but not limited thereto.

As mentioned above, a display device capable of forming the white light by mixing is provided by the present embodiment, wherein the numbers of the light emitting units in different sub-pixels of the display device is determined after calculation. According to the present embodiment, the display layer may include a blue sub-pixel, a red sub-pixel and a green sub-pixel, wherein the blue sub-pixel, the red sub-pixel and the green sub-pixel respectively includes a plurality of light emitting units. In addition, the number N3 of the light emitting units of the red sub-pixel may be greater than the number N1 of the light emitting units of the blue sub-pixel, and the number N2 of the light emitting units of the green sub-pixel may be greater than the number N1 of the light emitting units of the blue sub-pixel in the present embodiment. It should be noted that the numbers of the light emitting units shown in FIG. 2 and FIG. 3 are only illustrative, and the present disclosure is not limited thereto.

Other embodiments and variant embodiments of the present disclosure will be described in the following. In order to simplify the description, the same elements or layers mentioned above would be labeled with the same symbol in the following embodiments or variant embodiments. In addition, the differences between each of the embodiments and variant embodiments will be described in detail in the following contents, and the same features will not be redundantly described.

Next, the second embodiment of the present disclosure is described. Referring to FIG. 2 and FIG. 3, the disposition of the display layer 104 of the present embodiment is similar to the first embodiment, and one of the differences between the present embodiment and the first embodiment is the type of the light emitting unit and the disposition of the light converting element. In the present embodiment, the light emitting units in different sub-pixels corresponding to different colors of the display layer 104 may include the light emitting diodes with the same color, and the light converting elements may be disposed in some sub-pixels. For example, in the present embodiment, the light emitting units 130R of the red sub-pixel 110R, the light emitting units 130G of the green sub-pixel 110G and the light emitting units 130B of the blue sub-pixel 110B may all include blue light emitting diodes, and the layer 132G and the layer 132R in the display layer 104 (shown in FIG. 2) respectively corresponding to the green sub-pixel 110G and the red sub-pixel 110R may include the light converting elements, wherein the light converting element in the layer 132G may convert a blue light into a green light, and the light converting element in the layer 132R may convert a blue light into a red light. The above-mentioned light converting elements may for example include quantum dots. The quantum dot can be formed of semiconductor nanocrystalline structures, and may for example include cadmium selenide (CdSe), cadmium sulfide (CdS), cadmium telluride (CdTe), zinc selenide (ZnSe), zinc telluride (ZnTe), zinc sulfide (ZnS), mercury telluride (HgTe), indium arsenide (InAs), alloy ($Cd_{1-x}Zn_xSe_{1-y}S_y$), cadmium selenide/zinc sulfide (CdSe/ZnS), indium phosphide (InP) and gallium arsenide (GaAs), but not limited thereto. Because the blue light emitting diodes are used as the light emitting units in different sub-pixels in the present embodiment, the layer 132B corresponding to the blue sub-pixel 110B may not be provided with the light converting element. For example, the layer 132B may be the scattering layer or other suitable transparent layers, but not limited thereto. It should be noted that the light emitting units of the present embodiment are not limited to the blue light emitting diodes. In other embodiments, the green light emitting diode or the red light emitting diode may optionally be adopted, and each of the sub-pixels maybe matched with appropriate light converting element to form a display device.

Accordingly, the number of the light emitting units in different sub-pixels of the present embodiment may be calculated by formula (1) mentioned above, wherein the amount of light radiation of each of the colors may refer to the above-mentioned contents, and will not be redundantly described. In addition, because the display layer may include light converting elements (such as the light converting elements in the layer 132G and the layer 132R) in the present embodiment, the conversion efficiency of the light converting element in formula (1) should be considered. In the present embodiment, the conversion efficiency of the light converting element capable of converting the blue light into the green light (that is, the light converting element in the layer 132G) may for example range from 20% to 35%, and the conversion efficiency of the light converting element capable of converting the blue light into the red light (that is, the light converting element in the layer 132R) may for example range from 24% to 40%, but not limited thereto. After introducing the related values into formula (1), a ratio of the number N3 of the light emitting units of the red sub-pixel 110R to the number N1 of the light emitting units of the blue sub-pixel 110B may be obtained, which is shown in the following formula (4).

$$\frac{N3}{N1} = \frac{\text{amount of light radiation (red)} / \text{conversion efficiency (red)}}{\text{amount of light radiation (blue)} / \text{conversion efficiency (blue)}} \quad (4)$$

It should be noted that because the light emitting units used in the red sub-pixel 110R, the green sub-pixel 110G and the blue sub-pixel 110B are blue light emitting diodes in the present embodiment, the factor of luminous intensity of the light emitting units is not shown in formula (4) (because the values of the luminous intensity in the numerator and the denominator are substantially the same, they can be canceled out). In addition, the conversion efficiency (red) and the conversion efficiency (blue) shown in formula (4) are respectively the conversion efficiency of the light converting elements in the layer 132R and the layer 132B, and according to the above-mentioned contents, the conversion efficiency of the red light converting element may range from 24% to 40%, and the conversion efficiency of the blue light converting element may be one (because no light converting element is disposed in the layer 132B). Therefore, the ratio (N3/N1) of the number N3 of the light emitting units 130R of the red sub-pixel 110R to the number N1 of the light emitting units 130B of the blue sub-pixel 110B may be calculated after introducing the above-mentioned conditions into formula (4), which may range from 1.52 to 2.53 (1.52≤number of the light emitting units 130R/number of the light emitting units 130B≤2.53). Specifically, when the conversion efficiency of the light converting element in the layer 132R is 40%, the ratio of the number N3 of the light emitting units 130R of the red sub-pixel 110R to the number N1 of the light emitting units 130B of the blue sub-pixel 110B may be minimum, and the calculated value is 1.52; when the conversion efficiency of the light converting element in the layer 132R is 24%, the ratio of the number N3 of the light emitting units 130R of the red sub-pixel 110R to the number N1 of the light emitting units 130B of the blue sub-pixel 110B may be maximum, and the calculated value is 2.53. Therefore, in the present embodiment, when the number N1 of the light emitting units 130B of the blue sub-pixel 110B is one, the number N3 of the light emitting units 130R of the red sub-pixel 110R may be 1.52 to 2.53, and the light emitting units of the red sub pixel 110R and the blue sub pixel 110B may have the above-mentioned proportion of amount of light radiation for forming the white light after they pass through the light converting elements. According to the above-mentioned research, when the number N1 of the light emitting units 130B of the blue sub-pixel 110B is six, the number N3 of the light emitting units 130R of the red sub-pixel 110R may be ten to sixteen in the present embodiment, but not limited thereto.

Except for the light converting elements mentioned above, the conversion efficiency of the light converting element in the layer 132R may range from 29% to 35% in some embodiments. Therefore, the ratio of the number N3 of the light emitting units 130R of the red sub-pixel 110R to the number N1 of the light emitting units 130B of the blue sub-pixel 110B may be calculated by formula (4) under the above-mentioned conversion efficiency, wherein the ratio may range from 1.73 to 2.09 (1.73≤number of the light emitting units 130R/number of the light emitting units 130B≤2.09). The range of the ratio or the calculation of the maximum value and the minimum value may refer to the above-mentioned embodiments, and will not be redundantly described. In such conditions, when the blue sub-pixel 110B includes six light emitting units 130B, the red sub-pixel 110R may include eleven to thirteen light emitting units 130R, but not limited thereto.

Except for the ratio of the number of the light emitting units of the red sub-pixel 110R to the number of the light emitting units of the blue sub-pixel 110B, the ratio of the number of the light emitting units of the green sub-pixel 110G to the number of the light emitting units of the blue sub-pixel 110B may be calculated by a formula (5) in the present embodiment.

$$\frac{N2}{N1} = \frac{\text{amount of light radiation (green)}/\text{conversion efficiency (green)}}{\text{amount of light radiation (blue)}/\text{conversion efficiency (blue)}} \qquad (5)$$

Similarly, the values of the amount of light radiation in formula (5) may refer to the above-mentioned embodiments, and will not be redundantly described. In addition, the layer 132G may include the light converting element, wherein the conversion efficiency of the light converting element may range from 20% to 35%, and because no light converting element is disposed in the layer 132B (shown in FIG. 2) or the layer 132B maybe the scattering layer, the conversion efficiency thereof may be regarded as one. Therefore, the ratio of the number N2 of the light emitting units 130G of the green sub-pixel 110G to the number N1 of the light emitting units 130B of the blue sub-pixel 110B may be calculated after introducing the related values into the above-mentioned formula, which may range from 2.1 to 3.68 (2.1≤number of the light emitting units 130G/number of the light emitting units 130B≤3.68). When the conversion efficiency of the light converting element in the layer 132G is 35%, the ratio of the number N2 of the light emitting units 130G of the green sub-pixel 110G to the number N1 of the light emitting units 130B of the blue sub-pixel 110B may be minimum, which is 2.1, and when the conversion efficiency of the light converting element in the layer 132G is 20%, the ratio of the number N2 of the light emitting units 130G of the green sub-pixel 110G to the number N1 of the light emitting units 130B of the blue sub-pixel 110B may be maximum, which is 3.68. Therefore, when the number N1 of the light emitting units 130B of the blue sub-pixel 110B is one, the number N2 of the light emitting units 130G of the green sub-pixel 110G may be 2.1 to 3.68, and when the number N1 of the light emitting units 130B of the blue sub-pixel 110B is set to six according to the result of the research, the number N2 of the light emitting units 130G of the green sub-pixel 110G may for example be thirteen to twenty three in the present embodiment, but not limited thereto.

Except for the conversion efficiency of the light emitting element mentioned above, the conversion efficiency of the light converting element in the layer 132G may range from 25% to 30% in some embodiments. Therefore, the ratio of the number of the light emitting units of the green sub-pixel 110G to the number of the light emitting units of the blue sub-pixel 110B may be calculated by formula (5) under the above-mentioned conversion efficiency, wherein the ratio may range from 2.46 to 2.95 (2.46≤number of the light emitting units 130G/number of the light emitting units 130B≤2.95). In such conditions, when the blue sub-pixel 110B includes six light emitting units 130B, the green sub-pixel 110G may include fifteen to eighteen blue light emitting diodes as the light emitting units 130G, but not limited thereto.

Next, the third embodiment of the present disclosure is described. In the third embodiment of the present disclosure, one of the differences between the third embodiment and the first embodiment is the type of the light emitting unit and the disposition of the light converting element. According to the present embodiment, the light emitting units 130B of the blue sub-pixel 110B may include blue light emitting diodes, the light emitting units 130G of the green sub-pixel 110G may include green light emitting diodes, and the light emitting units 130R of the red sub-pixel 110R may include blue light emitting diodes, but not limited thereto. Because the light emitting units 130B of the blue sub-pixel 110B include blue light emitting diodes, and the light emitting units 130G of the green sub-pixel 110G include green light emitting diodes, the layer 132G and the layer 132B may not include light converting element, or, the layer 132G and the layer 132B may be the scattering layer or other suitable transparent layers in the present embodiment. Because the light emitting units 130R of the red sub-pixel 110R include blue light emitting diodes instead of red light emitting diodes, the layer 132R may include the light converting element for converting the light of the light emitting units 130R into the red light. The description related to the light converting element in the layer 132R may refer to the above-mentioned embodiments, and will not be redundantly described.

Similarly, the numbers of the light emitting units in each of the sub-pixels may be determined according to formula (1) mentioned above, the type of the light emitting units and the disposition of the light converting elements of the present embodiment. According to the present embodiment, a ratio of the number N3 of the light emitting units 130R (blue light emitting diode) of the red sub-pixel 110R to the number N2 of the light emitting units 130G (green light emitting diode) of the green sub-pixel 110G may be shown in the following formula (6).

$$\frac{N3}{N2} = \frac{\text{amount of light radiation (red)}/(\text{EQE (blue)} \times \text{conversion efficiency (red)})}{\text{amount of light radiation (green)}/\text{EQE (green)}} \qquad (6)$$

In formula (6), because the light emitting units 130R of the red sub-pixel 110R of the present embodiment include blue light emitting diodes, the calculation of the number N3 in the red sub-pixel 110R is based on the EQE value of the blue light emitting diode. In addition, because no light converting element is disposed in the layer 132G in the present embodiment, the conversion efficiency of the light converting element in the green sub-pixel 110G may be regarded as one. Therefore, the conversion efficiency of the green light converting element is not shown in formula (6).

Other values in formula (6) may refer to the above-mentioned embodiments, and will not be redundantly described. The ratio of the number N3 of the light emitting units 130R of the red sub-pixel 110R to the number N2 of the light emitting units 130G of the green sub-pixel 110G may be calculated after introducing the related values into the above-mentioned formula, which may range from 0.55 to 2.4 (0.55≤number of the light emitting units 130R/number of the light emitting units 130G≤2.4). When the EQE of the blue light emitting diode is 30%, the conversion efficiency of the light converting element in the layer 132R is 40%, and the EQE of the green light emitting diode is 8%, the ratio of the number N3 of the light emitting units 130R of the red sub-pixel 110R to the number N2 of the light emitting units 130G of the green sub-pixel 110G may be minimum, which is 0.55, and when the EQE of the blue light emitting diode is 20%, the conversion efficiency of the light converting element in the layer 132R is 24%, and the EQE of the green light emitting diode is 14%, the ratio of the number N3 of the light emitting units 130R of the red sub-pixel 110R to the number N2 of the light emitting units 130G of the green sub-pixel 110G may be maximum, which is 2.4. Therefore, when the number N2 of the light emitting units 130G of the green sub-pixel 110G is set to six according to the result of the research mentioned above, the number N3 of the light emitting units 130R of the red sub-pixel 110R may be six to fifteen, and the lights emitted by the light emitting units of the red sub pixel 110R and the green sub pixel 110G may have the above-mentioned proportion of amount of light radiation for forming the white light after they pass through the layer 132R and the layer 132G.

Next, the fourth embodiment of the present disclosure is described. One of the differences between the present embodiment and the first embodiment is the type of the light emitting unit and the disposition of the light converting element. According to the present embodiment, the light emitting units 130B of the blue sub-pixel 110B shown in FIG. 2 may include blue light emitting diodes, the light emitting units 130G of the green sub-pixel 110G shown in FIG. 2 may include blue light emitting diodes, and the light emitting units 130R of the red sub-pixel 110R shown in FIG. 2 may include red light emitting diodes, but not limited thereto. Because the light emitting units 130B of the blue sub-pixel 110B include blue light emitting diodes, and the light emitting units 130R of the red sub-pixel 110R include red light emitting diodes, the layer 132R and the layer 132B may not include light converting element in the present embodiment. Because the light emitting units 130G of the green sub-pixel 110G include blue light emitting diodes instead of green light emitting diodes, the layer 132G may include the light converting element for converting the light of the light emitting units 130G into the green light. The description related to the light converting element in the layer 132G may refer to the above-mentioned embodiments, and will not be redundantly described.

Similarly, the numbers of the light emitting units in each of the sub-pixels may be determined according to formula (1) mentioned above, the type of the light emitting units and the disposition of the light converting elements of the present embodiment. According to the present embodiment, a ratio of the number N3 of the light emitting units 130R (red light emitting diode) of the red sub-pixel 110R to the number N2 of the light emitting units 130G (blue light emitting diode) of the green sub-pixel 110G may be shown in the following formula (7).

$$\frac{N3}{N2} = \frac{\text{amount of light radiation (red)}/\text{EQE (red)}}{\text{amount of light radiation (green)}/(\text{EQE (blue)} \times \text{conversion efficiency (green)})} \quad (7)$$

In formula (7), because the light emitting units 130G of the green sub-pixel 110G of the present embodiment include blue light emitting diodes, the calculation of the number N2 in the green sub-pixel 110G is based on the EQE value of the blue light emitting diode in formula (7). In addition, because no light converting element is disposed in the layer 132R in the present embodiment, the conversion efficiency of the light converting element in the red sub-pixel 110R may be regarded as one. Therefore, the conversion efficiency of the red light converting element is not shown in formula (7). Other values in formula (7) may refer to the above-mentioned embodiments, and will not be redundantly described. The ratio of the number N3 of the light emitting units 130R of the red sub-pixel 110R to the number N2 of the light emitting units 130G of the green sub-pixel 110G may be calculated after introducing the related values into the above-mentioned formula, which may range from 0.33 to 2.88 (0.33≤number of the light emitting units 130R/number of the light emitting units 130G≤2.88). When the EQE of the blue light emitting diode is 20%, the conversion efficiency of the light converting element in the layer 132G is 20%, and the EQE of the red light emitting diode is 10%, the ratio of the number N3 of the light emitting units 130R of the red sub-pixel 110R to the number N2 of the light emitting units 130G of the green sub-pixel 110G may be minimum, which is 0.33, and when the EQE of the blue light emitting diode is 30%, the conversion efficiency of the light converting element in the layer 132G is 35%, and the EQE of the red light emitting diode is 3%, the ratio of the number N3 of the light emitting units 130R of the red sub-pixel 110R to the number N2 of the light emitting units 130G of the green sub-pixel 110G may be maximum, which is 2.88. Therefore, when the number N2 of the light emitting units 130G of the green sub-pixel 110G is set to six according to the result of the research mentioned above, the number N3 of the light emitting units 130R of the red sub-pixel 110R may be six to eighteen, and the lights emitted by the light emitting units of the red sub pixel 110R and the green sub pixel 110G may have the above-mentioned proportion of amount of light radiation for forming the white light after they pass through the layer 132R and the layer 132G. It should be noted that when the number N2 of the light emitting units 130G of the green sub-pixel 110G is set to six, the number of the blue light emitting diodes is not considered in the present embodiment.

Figure 4:
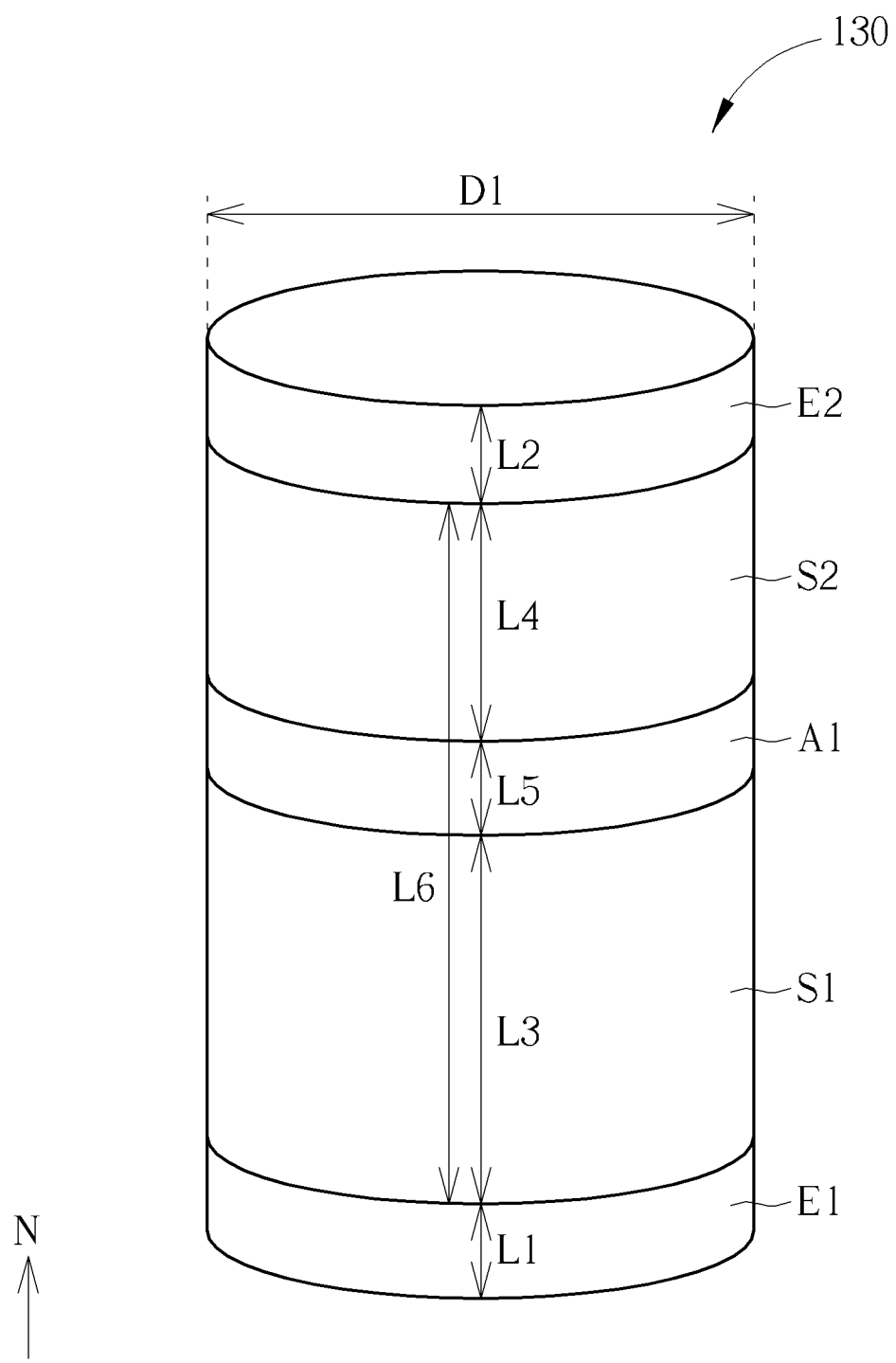
FIG. 4 schematically illustrates an appearance of a light emitting unit according to an embodiment of the present disclosure.

Referring to FIG. 4, FIG. 4 schematically illustrates an appearance of a light emitting unit according to an embodiment of the present disclosure. As shown in FIG. 4, the light emitting unit 130 may for example be a light emitting diode, wherein the light emitting unit may include a first electrode E1, a second electrode E2, a first semiconductor layer S1, a second semiconductor layer S2 and an active layer A1. The first electrode E1 and the second electrode E2 may include any suitable conductive material to be served as the electrode of the light emitting diode, such as chromium, titanium, aluminum, gold, nickel, tin, silver, indium tin oxide (ITO), other suitable conductive materials or the combinations of the above-mentioned materials. The first semiconductor layer S1 and the second semiconductor layer S2 may respectively include a p-type semiconductor material or a n-type semiconductor material, that is, one of the first semiconductor layer S1 and the second semiconductor layer S2 may include the p-type semiconductor material, and another one of the first semiconductor layer S1 and the second semiconductor layer S2 may include the n-type semiconductor material, wherein the semiconductor material may include indium gallium aluminum nitride (InAlGaN), gallium nitride (GaN), aluminum gallium nitride (AlGaN), indium gallium nitride (InGaN), aluminum nitride (AlN), indium nitride (InN), other suitable materials or the combinations of the above-mentioned materials. For example, the first semiconductor layer S1 of the present embodiment may be an n-type semiconductor including the above-mentioned semiconductor materials, and may be doped with dopants such as silicon, germanium and tin. The second semiconductor layer S2 may be a p-type semiconductor including the above-mentioned semiconductor materials, and may be doped with dopants such as magnesium, but not limited thereto. The active layer A1 maybe the region where the light emitting diode generates lights, and may for example include a single quantum well structure or a multiple quantum well structure. In addition, the active layer A1 may for example be formed of the aluminum gallium nitride layer or the indium gallium aluminum nitride layer in the present embodiment, but not limited thereto.

Figures 7, 8:
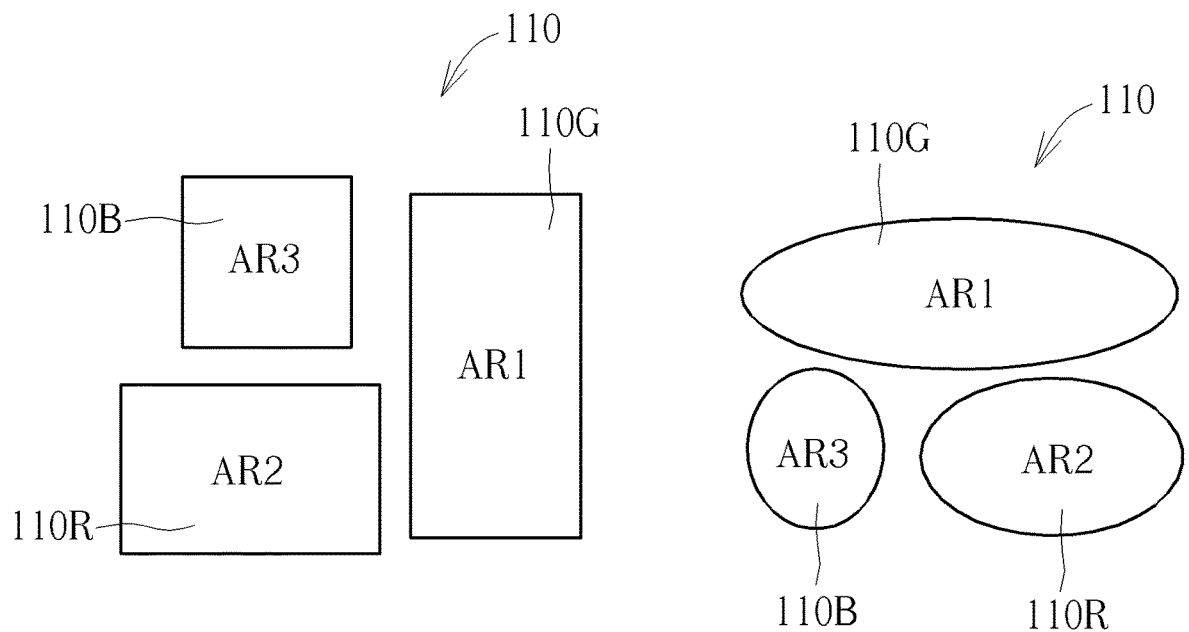
FIG. 7 to FIG. 10 schematically illustrate configurations of sub-pixels of a display device according to the present disclosure.

In the present embodiment, in order to transfer the light emitting diodes to the target substrate more conveniently in the massive transfer step of the manufacturing process of the light emitting diodes, the light emitting diodes may be miniaturized, wherein the massive transfer technique of the present embodiment may be the fluid transfer, but not limited thereto. In addition, in order to take into account the convenience of bonding on the target substrate after the massive transfer step, the shape of the light emitting diodes may be designed to have a bar form, such as the cylinder shown in FIG. 7. According to the present embodiment, considering the manufacturing process factors of the light emitting diodes and the luminous efficiency of the light emitting diodes, the thickness of the light emitting diodes may be designed to take into account the above factors. For example, the manufacturing process of the light emitting unit 130 may include the metal organic chemical vapor deposition (MOCVD) step, and because the yield of the MOCVD process may be poor when the light emitting unit 130 is too thin, the light emitting unit 130 may have a certain thickness, and the characteristic length D1 of the light emitting unit 130 can be reduced to achieve the purpose of miniaturizing the light emitting diode. It should be noted that the thicknesses of the light emitting unit or each of the layers in the light emitting unit can be respectively defined as the maximum thickness of the light emitting unit or the maximum thickness of each of the layers of the light emitting unit measured in a normal direction N of the lower surface of the first electrode E1, and the characteristic length D1 is the maximum length of the light emitting unit 130 measured in the direction orthogonal to the normal direction N. When the light emitting unit 130 is a cylinder shown in FIG. 4, the characteristic length D1 may be the diameter of the cylinder. However, as mentioned above, when the characteristic length D1 of the light emitting unit 130 is too short, the effective light emitting area of the light emitting unit 130 may be reduced, and the luminous efficiency of the light emitting unit 130 may thereby be reduced. In the present embodiment, each of the layers of the light emitting unit 130 may have a certain thickness range, and the light emitting unit 130 of the present embodiment may have the advantages of facilitating the mass transfer or improving luminous efficiency through the certain thickness range. Specifically, a thickness L1 of the first electrode E1 of the light emitting unit 130 and a thickness L2 of the second electrode E2 of the light emitting unit 130 may respectively range from 0.02 micrometers (μm) to 1 μm (0.02 μm≤thicknesses of the electrodes≤1 μm), a thickness L3 of the first semiconductor layer S1 may for example range from 1.5 82 m to 5 μm (1.5 μm≤thickness of the first semiconductor layer≤5 μm), a thickness L4 of the second semiconductor layer S2 may for example range from 0.08 μm to 0.25 μm (0.08 μm≤thickness of the second semiconductor layer≤0.25 μm), and a thickness L5 of the active layer A1 may for example range from 0.05 μm to 0.25 μm (0.05 μm≤thickness of the active layer≤0.25 μm), but not limited thereto. Therefore, according to the thicknesses of the layers mentioned above, a thickness L6 of a light emitting layer of the light emitting unit 130 may range from 1.63 μm to 5.5 μm (1.63 μm≤thickness of the light emitting layer≤5.5 μm) in the present embodiment, but not limited thereto. It should be noted that the thickness of the light emitting layer of the light emitting unit 130 mentioned above is the total thickness of the first semiconductor layer S1, the active layer A1 and the second semiconductor layer S2. In addition, in the embodiment shown in FIG. 4, the diameter (the characteristic length D1 of the light emitting unit) of the cylindrical light emitting unit 130 may range from 0.05 μm to 3 μm (0.05 μm≤diameter≤3 μm) or 50 nanometers (nm) to 3000 nm (50 nm≤diameter≤3000 nm), but not limited thereto. In the present disclosure, the thickness of each of the layers of the light emitting unit 130 is controlled within the above-mentioned ranges to improve the luminous efficiency or the convenience in the mass transfer process of the light emitting unit 130.

Figure 5:
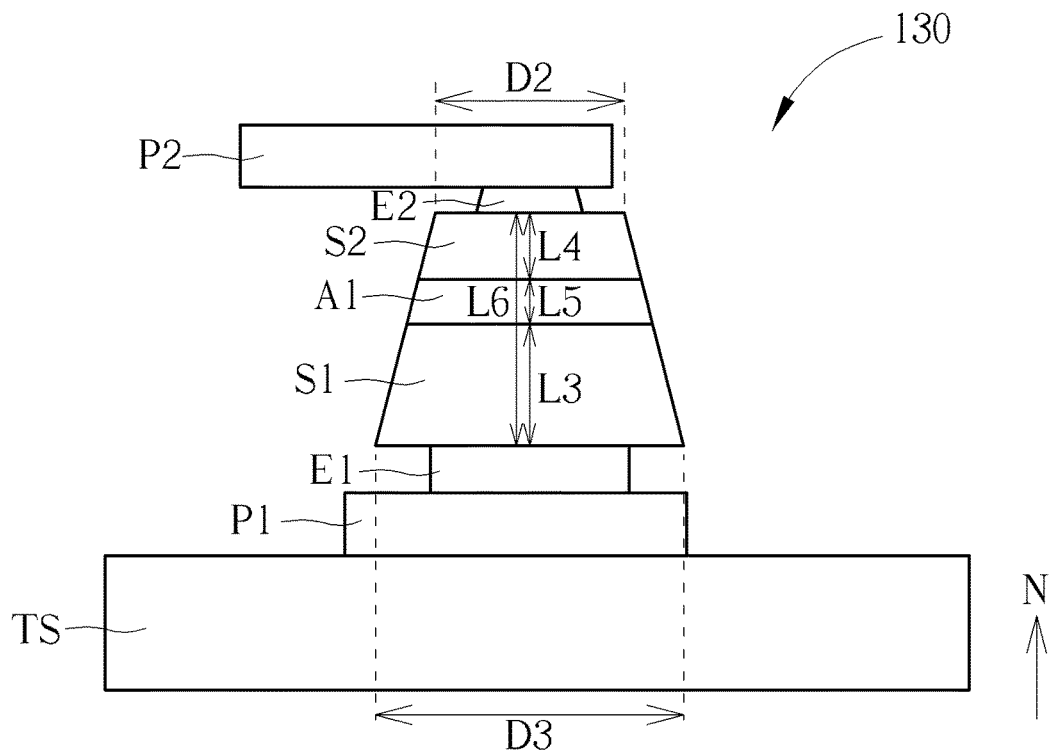
FIG. 5 schematically illustrates a cross-sectional view of a light emitting unit according to another embodiment of the present disclosure.

Referring to FIG. 5, FIG. 5 schematically illustrates a cross-sectional view of a light emitting unit according to another embodiment of the present disclosure. One of the differences between the light emitting unit shown in FIG. 5 and the light emitting unit shown in FIG. 4 is that the light emitting units have different shapes. As shown in FIG. 5, the light emitting unit 130 may for example include a columnar structure formed of the first electrode E1, the first semiconductor layer S1, the active layer A1, the second semiconductor layer S2 and the second electrode E2 stacked in sequence. The lower surface of the first semiconductor layer S1 and the upper surface of the second semiconductor layer S2 may for example (but not limited to) be circular, and the cross-sectional view thereof may be a trapezoid or an inverse trapezoid (not shown in FIG. 5), but not limited thereto. According to the present embodiment, the first electrode E1 and the second electrode E2 of the light emitting unit 130 may for example be electrically connected to the target substrate or electrically connected to the corresponding wire through the conductive pads. For example, the first electrode E1 may be electrically connected to the target substrate TS or the corresponding wire through the conductive pad P1, and the second electrode E2 may be electrically connected to another target substrate (not shown in FIG. 5) or the corresponding wire through another conductive pad P2, but not limited thereto. The material and the thickness range of each of the layers of the light emitting unit 130 shown in FIG. 5 may refer to the related description of FIG. 4, and will not be redundantly described here. It should be noted that the length of the upper edge of the second semiconductor layer S2 may represent the characteristic length D2 of the second semiconductor layer S2. For example, when the top view of the upper surface of the second semiconductor layer S2 is a circle, the characteristic length D2 may be the diameter of the second semiconductor layer S2. Similarly, the length of the lower line of the first semiconductor layer S1 may represent the characteristic length D3 of the first semiconductor layer S1. For example, when the top view of the lower surface of the first semiconductor layer S1 is a circle, the characteristic length D3 may be the diameter of the first semiconductor layer S1, and the measuring method of the diameter maybe similar to the embodiment shown in FIG. 4, which will not be redundantly described. It should be noted that the ranges of the characteristic length D2 and the characteristic length D3 of the present embodiment may refer to the range of the characteristic length D1 mentioned above, and will not be redundantly described. In the present embodiment, the top view of each of the layers of the light emitting unit is not limited to circle. For example, in some embodiments, when the top view of the surface of each of the layers of the light emitting unit is a rectangle, the characteristic length D2 and the characteristic length D3 may respectively be the maximum diagonal lengths of the upper surface of the second semiconductor layer S2 and the lower surface of the first semiconductor layer S1.

Figure 6:
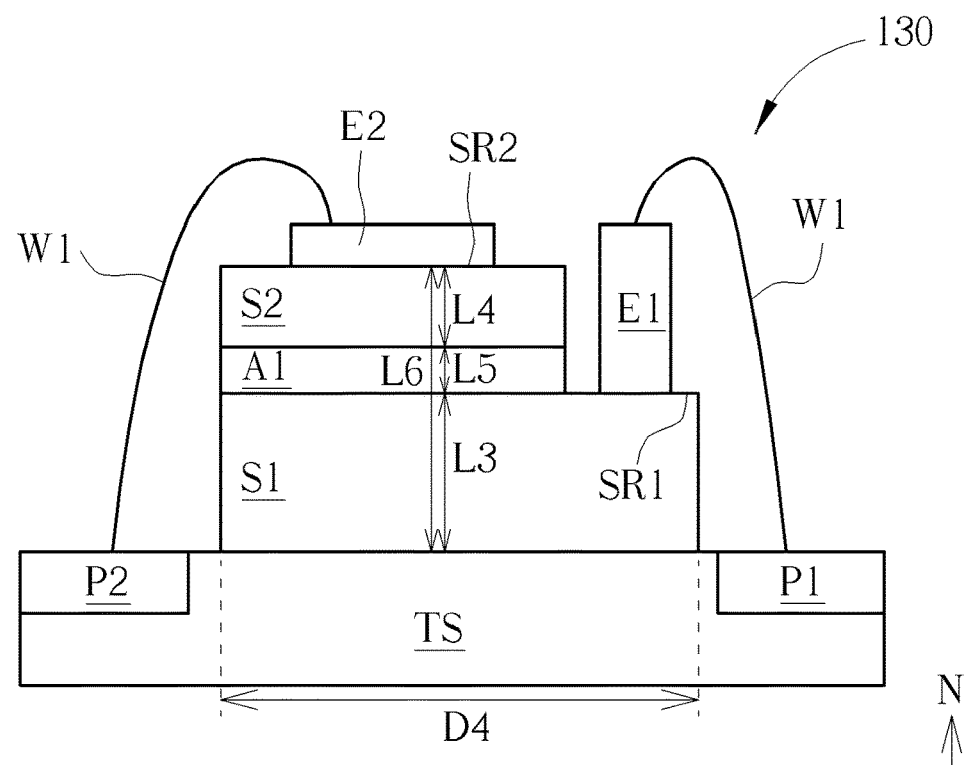
FIG. 6 schematically illustrates a cross-sectional view of a light emitting unit according to yet another embodiment of the present disclosure.

Referring to FIG. 6, FIG. 6 schematically illustrates a cross-sectional view of a light emitting unit according to yet another embodiment of the present disclosure. One of the differences between the light emitting unit shown in FIG. 6 and the light emitting unit shown in FIG. 4 is that the light emitting units (such as the light emitting diode) have different shapes. As shown in FIG. 6, the first electrode E1 and the second electrode E2 of the light emitting unit 130 may be disposed at the same side of the light emitting unit 130 in the present embodiment, for example, may be disposed on the upper side of the light emitting unit 130, but not limited thereto. Specifically, the first semiconductor layer S1, the active layer A1 and the second semiconductor layer S2 of the light emitting unit 130 may be stacked in sequence, wherein the length, width and/or diameter of the first semiconductor layer S1 may for example be greater than the lengths, widths and/or diameters of the active layer A1 and the second semiconductor layer S2, and the active layer A1 and the second semiconductor layer S2 may expose a portion of the upper surface SR1 of the first semiconductor layer S1, and the first electrode E1 may be disposed on the exposed portion of the upper surface SR1 of the first semiconductor layer S1. Therefore, the first electrode E1 and the second electrode E2 disposed on the upper surface SR2 of the second semiconductor layer S2 may be located at the same side. In the present embodiment, the first electrode E1 and the second electrode E2 may for example be electrically connected to the conductive pad P1 and the conductive pad P2 on the target substrate TS through the wires W1 respectively, but not limited thereto. In some embodiments, the light emitting unit 130 shown in FIG. 6 may be turned upside down and disposed in a flip-chip way (not shown), and the first electrode E1 and the second electrode E2 may be located at the lower side of the light emitting unit 130, and may be electrically connected to the conductive pad P1 and the conductive pad P2 respectively, thereby electrically connecting the light emitting unit 130 to the target substrate TS, but not limited thereto. The material and thickness of each of the layers of the present embodiment may refer to the related description of FIG. 4, and will not be redundantly described. It should be noted that the characteristic length D4 shown in FIG. 6 may for example be the maximum length, width, diagonal length or diameter of the light emitting unit 130, but not limited thereto.

Different types of the light emitting units in the above-mentioned embodiments may be applied to the display devices of the first embodiment to the fourth embodiment of the present disclosure. That is, the type, the shape and the thickness of light emitting units in the display devices of the first embodiment to the fourth embodiment of the present disclosure may refer to the light emitting unit of each of the embodiments.

Referring to FIG. 7 to FIG. 10, FIG. 7 to FIG. 10 schematically illustrate configurations of sub-pixels of a display device according to the present disclosure, wherein the configurations of the sub-pixels in one pixel of different embodiments are shown. As mentioned above, one of the pixels 110 in the display layer of the present disclosure may be formed of a red sub-pixel 110R, a green sub-pixel 110G and a blue sub-pixel 110B, wherein the red sub-pixel 110R, the green sub-pixel 110G and the blue sub-pixel 110B may be designed to be mixed to form the white light. According to the above-mentioned contents, when the lights emitted by the red sub-pixel 110R, the green sub-pixel 110G and the blue sub-pixel 110B are mixed to form the white light of target brightness, the proportion of the green light in the brightness perceived by the human eyes will be the greatest, and the proportion of the red light may be greater than the proportion of the blue light. Therefore, the area of the green sub-pixel 110G may for example be greater than the area of the red sub-pixel 110R, and the area of the red sub-pixel 110R may be greater than the area of the blue sub-pixel 110B in the present disclosure, but the present disclosure is not limited thereto.

Figures 9, 10:
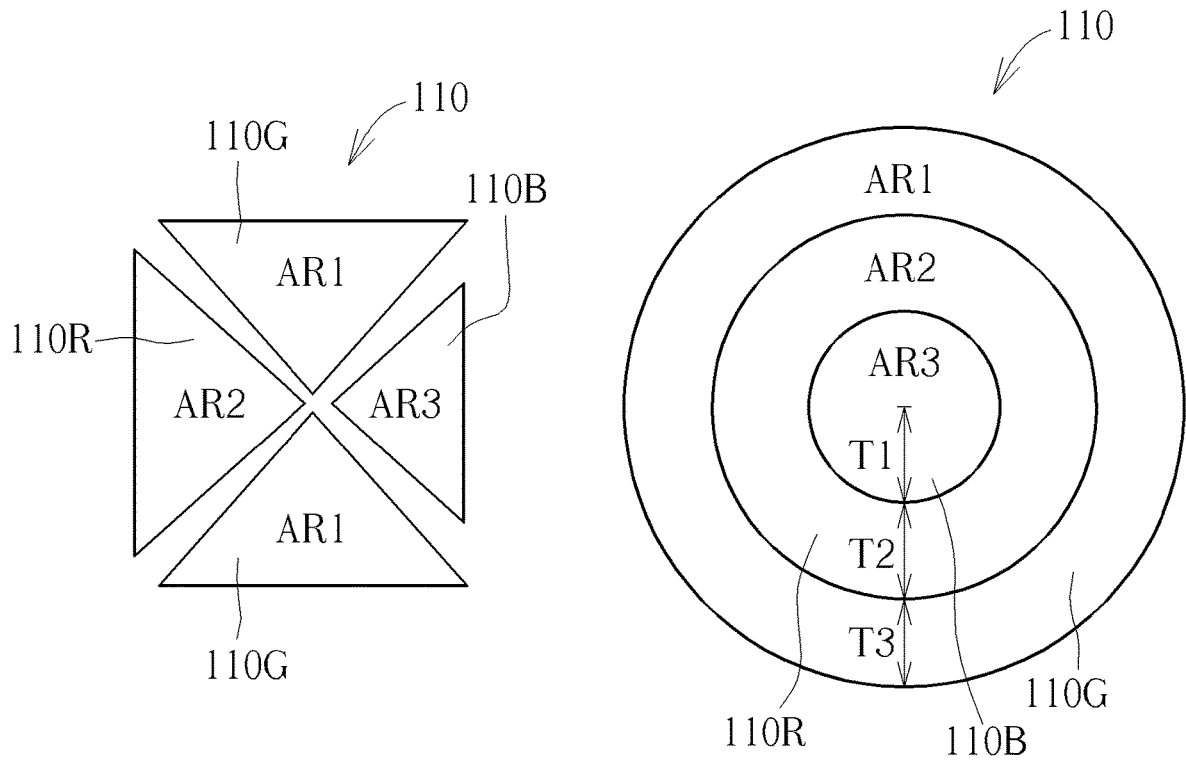

FIG. 7 to FIG. 10 show several kinds of arrangements, shapes, and area distributions of the red sub-pixel 110R, the green sub-pixel 110G and the blue sub-pixel 110B of the present disclosure, wherein the area AR1 of the green sub-pixel 110G may be greater than the area AR2 of the red sub-pixel 110R, and the area AR2 of the red sub-pixel 110R may be greater than the area AR3 of the blue sub-pixel 110B (that is, area AR3<area AR2<area AR1). In addition, the shapes of the green sub-pixel 110G, the red sub-pixel 110R and the blue sub-pixel 110B may be a rectangle, an ellipse or a triangle. In addition, the green sub-pixel 110G, the red sub-pixel 110R and the blue sub-pixel 110B maybe arranged dispersedly or arranged in concentric circles, which is shown in FIG. 10. It should be noted that although several kinds of area proportions, shapes and arrangements of the sub-pixels are shown in FIG. 7 to FIG. 10, the present disclosure is not limited thereto. In addition, it should be noted that when a certain sub-pixel is divided into multiple regions, the sum of the numbers of light emitting units in each of the regions needs to comply with the calculated result obtained by the method of calculating the number of the light emitting units of the present disclosure.

In summary, a display device is provided by the present disclosure. The display layer of the display device includes blue sub-pixels, red sub-pixels and green sub-pixels, wherein the numbers of the light emitting units of the blue sub-pixel, the red sub-pixel and the green sub-pixel may be designed, and the lights of the light emitting units may be mixed to form the white light. In addition, the shape and the thickness of the light emitting unit of the present disclosure can be designed to improve the convenience of the mass transfer and the luminous efficiency of the light emitting unit.

Those skilled in the art will readily observe that numerous modifications and alterations of the device and method may be made while retaining the teachings of the disclosure.

Accordingly, the above disclosure should be construed as limited only by the metes and bounds of the appended claims.

What is claimed is:

1. A display device, comprising:
   a blue sub-pixel comprising a plurality of first light emitting units in a number of N1;
   a green sub-pixel comprising a plurality of second light emitting units in a number of N2; and
   a red sub-pixel comprising a plurality of third light emitting units in a number of N3,
   wherein an area of the green sub-pixel is greater than an area of the red sub-pixel, the area of the red sub-pixel is greater than an area of the blue sub-pixel, the first light emitting units, the second light emitting units and the third light emitting units all emit lights in a color of blue, and a green wavelength conversion layer and a red wavelength conversion layer are so arranged that the blue light from the second light emitting units and the blue light from the third light emitting units go through the green wavelength conversion layer and the red wavelength conversion layer respectively, wherein N1 is greater than or equal to 6, N1<N2 and N1<N3, wherein N2/N1 is between 2.1 and 3.68, and N3/N1 is between 1.52 and 2.53, and
   wherein a conversion efficiency of the green wavelength conversion layer is in a range from 20% to 35%, and a conversion efficiency of the red wavelength conversion layer is in a range from 24% to 40%;
   wherein the plurality of first light emitting units are irregularly spaced in the area of the blue sub-pixel, the plurality of second light emitting units are irregularly spaced in the area of the green sub-pixel, and the plurality of third light emitting units are irregularly spaced in the area of the red sub-pixel.

2. The display device according to claim 1, wherein the first light emitting units, the second light emitting units and the third light emitting units are light emitting diodes (LEDs) in a bar form with a diameter in a range of 50 to 3000 nm.

3. The display device according to claim 1, wherein the first light emitting units, the second light emitting units and the third light emitting units are light emitting diodes in a bar form with a thickness in a range of 1.63 to 5.5 µm.

4. The display device according to claim 1, wherein N3/N1 is between 1.73 and 2.09.

5. The display device according to claim 1, wherein N2/N1 is between 2.46 and 2.95.

6. A display device, comprising:
   a blue sub-pixel comprising a plurality of first light emitting units in a number of N1;
   a green sub-pixel comprising a plurality of second light emitting units in a number of N2; and
   a red sub-pixel comprising a plurality of third light emitting units in a number of N3,
   wherein an area of the green sub-pixel is greater than an area of the red sub-pixel, the area of the red sub-pixel is greater than an area of the blue sub-pixel, the first light emitting units, the second light emitting units and the third light emitting units all emit lights in a color of blue, and a green wavelength conversion layer and a red wavelength conversion layer are so arranged that the blue light from the second light emitting units and the blue light from the third light emitting units go through the green wavelength conversion layer and the red wavelength conversion layer respectively, wherein N1<N2 and N1<N3, wherein N2/N1 is between 2.1 and 3.68, and N3/N1 is between 1.52 and 2.53, and
   wherein a conversion efficiency of the green wavelength conversion layer is in a range from 20% to 35%, and a conversion efficiency of the red wavelength conversion layer is in a range from 24% to 40%;
   wherein the plurality of first light emitting units are irregularly spaced in the area of the blue sub-pixel, the plurality of second light emitting units are irregularly spaced in the area of the green sub-pixel, and the plurality of third light emitting units are irregularly spaced in the area of the red sub-pixel.

7. The display device according to claim 6, wherein N3/N1 is between 1.73 and 2.09.

8. The display device according to claim 6, wherein N2/N1 is between 2.46 and 2.95.

9. The display device according to claim 1, further comprising a light shielding material surrounding the green wavelength conversion layer and the red wavelength conversion layer and not overlapped with the plurality of first light emitting units, the plurality of second light emitting units and the plurality of third light emitting units, wherein in a cross-sectional view of the display device, the light shielding material includes a trapezoidal shape.

* * * * *